United States Patent [19]

Duncan

[11] Patent Number: 5,420,597
[45] Date of Patent: May 30, 1995

[54] FARFIELD SIMULATOR FOR TESTING AUTOTRACK ANTENNAS

[75] Inventor: James W. Duncan, Placentia, Calif.
[73] Assignee: TRW Inc., Redondo Beach, Calif.
[21] Appl. No.: 212,550
[22] Filed: Mar. 14, 1994

Related U.S. Application Data

[63] Continuation of Ser. No. 758,136, Sep. 12, 1991, abandoned.

[51] Int. Cl.⁶ .................................. G01R 29/10
[52] U.S. Cl. ...................... 343/703; 343/786; 333/21 R; 342/365
[58] Field of Search ............ 343/703, 772–775, 343/781 CA, 837, 786, 753; 333/21 R, 125, 137; 29/600; 342/365

[56] References Cited

U.S. PATENT DOCUMENTS

| 4,797,681 | 1/1989 | Kaplan et al. | 343/786 |
| 5,066,959 | 11/1991 | Huder | 343/786 |
| 5,237,334 | 8/1993 | Waters | 343/753 |

FOREIGN PATENT DOCUMENTS 0019775  1/1990  Japan ........................ 343/703

OTHER PUBLICATIONS

Test Procedure for Antennas, IEEE No. 149, Jan. 1965.
Inexpensive Multi-Mode Satellite Tracking Feed Antenna, P. D. Patel, IEEE Proceedings, vol. 135, Pt. H., No. 6, Dec. 1988.
A 60 GHZ Beam Waveguide Antenna System For Satellite Crosslinks, R. J. Meier and Y. P. Loh, General Electric Company, Astro-Space Division, VFSC, IEEE 1987.
A Mode Extraction Network for RF Sensing in Satellite Reflector Antenna B. K. Watson, N. D. Dang, S. Ghosh, ERA Technology Ltd., UK, Apr. 1981.

Primary Examiner—Donald Hajec
Assistant Examiner—Tan Ho

[57] ABSTRACT

A simulation device is provided for testing autotrack antennas. The device includes a mode coupler and transmit horn which are identical to the mode coupler and transmit horn of the antenna to be tested. The mode coupler has a plurality of waveguide input ports for transmitting voltage signals which are complex conjugates of signals occurring under receiving conditions. The device then generates a signal that simulates the far-field, plane-wave testing environment and applies this signal to an antenna to be tested.

17 Claims, 2 Drawing Sheets

FARFIELD SIMULATOR FOR TESTING AUTOTRACK ANTENNAS

This is a continuation of U.S. patent application Ser. No. 07/758,136, filed Sep. 12, 1991, now abandoned.

BACKGROUND OF THE INVENTION

1. Field Of The Invention

This invention relates to autotrack antenna systems and, more particularly, to a simulation technique for testing autotrack antennas.

2. Discussion

Many communication systems require high gain reflector antennas for acquiring and tracking a signal. An autotrack system is generally employed to keep the antenna pointed in the direction of the incoming signal, which, for communication satellites and the like, changes as a function of time because of the changing position of the antenna in relation to the source of the signal.

Generally, an autotrack antenna employs a sum pattern and a difference pattern. In some cases, the antenna may employ two orthogonal difference patterns for azimuth plane and elevation plane error sensing. The sum pattern is a high-gain/pencil-beam used for transmit and receive communications. The difference pattern under receiving conditions provides error signal voltages that are proportional to the angle of arrival of the incoming wave, relative to the boresight axis of the reflector. A servo control system is employed to steer the reflector antenna so as to cause the error voltages to vanish, which occurs when the boresight axis is pointed at the transmitting terminal of the incoming signal.

The testing of autotrack antenna systems is generally required to provide for accurate verification of autotrack direction angle sensing for a selected set of incident plane-wave directions. Currently, autotrack antenna systems are normally tested under receive conditions on a far-field antenna range, which is a test environment representative of operational conditions. However, such testing requires that each autotrack antenna system be transported to and set up with the far-field antenna range. As a result, a considerable amount of time and expense are generally required.

It is therefore desirable to obtain a simplified or alternate technique for testing autotrack antennas. It is further desirable to obtain such a testing technique which provides substantial cost savings by reducing the time required to perform the testing.

SUMMARY OF THE INVENTION

According to the teachings of the present invention, a simulation device is provided for testing autotrack antennas. The device includes a mode coupler having a plurality of waveguide input ports. The mode coupler is identical to the mode coupler found on the antenna that is to be tested. A transmit horn is connected to the mode coupler and is also identical to the receiver horn found on the antenna to be tested. Voltage signals are applied to the plurality of waveguide input ports which are complex conjugates of voltage signals detected under receiving conditions. As a result, the autotrack antenna receives a signal which simulates the far-field, plane-wave testing environment.

BRIEF DESCRIPTION OF THE DRAWINGS

The various advantages of the present invention will become apparent to those skilled in the art by reading the following specifications and by reference to the drawings in which.

DETAILED DESCRIPTION OF THE PREFERRED EMBODIMENT

Figure 1:
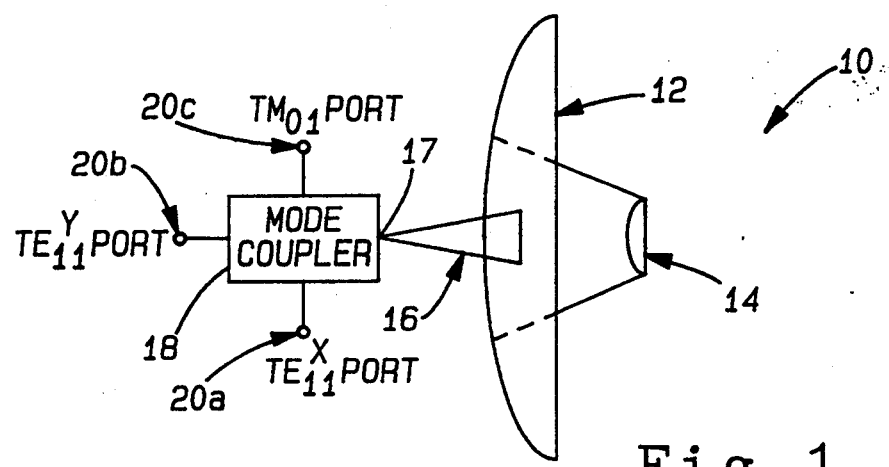
FIG. 1 is a schematic diagram which illustrates a cassegrain antenna having an autotrack feed system.

Turning now to FIG. 1, a cassegrain antenna 10 having an autotrack feed system is shown therein. The cassegrain antenna 10 is a dual reflector cassegrain having a parabolic main reflector 12 and a smaller hyperbolic sub-reflector 14 mounted outwards therefrom. The cassegrain antenna can also be configured using a shaped main reflector and subreflector, that is, deviating from the classic cassegrain using parabolic and hyperbolic reflectors. The antenna 10 further includes a conical corrugated feed horn 16 that is aligned with the sub-reflector 14. Other types of feed horns may also be utilized as, for example, a smooth wall conical horn, a Potter dual-mode horn, or a multiflare horn.

The feed horn 16 is connected to a mode coupler 18 by way of a circular cross-section metal waveguide 17. The mode coupler 18 shown in FIG. 1 is a cylindrical waveguide junction having three rectangular waveguide output ports 20a, 20b and 20c. However, for purposes of this invention the mode coupler 18 may be adapted with any number of a plurality of rectangular waveguide output ports. The incident plane wave field is focused to the feed horn by the cassegrain antenna and generates a plurality of modes in the circular waveguide 17 and mode coupler 18, wherein the specific number of modes is determined by the waveguide/coupler dimensions. The output ports 20a, 20b, and 20c extract energy (signals) from the mode coupler 18 corresponding to particular modes in the mode coupler 18. For the case at hand, the modes include a circularly polarized transverse electric ($TE_{11}$) mode and the higher order transverse magnetic ($TM_{01}$) mode.

The cassegrain antenna 10 may be adapted to provide both transmission and reception of wavelike signals. However, for purposes of tracking an incoming signal, the antenna 10 in conjunction with its autotrack feed system is adapted to receive a signal from a transmission source. In a receiving condition, the main reflector 12 gathers and collects an incoming signal such as a circularly polarized (CP) signal and reflects the signal to the sub-reflector 14. The reflected signal is then reflected from sub-reflector 14 and directed to feed horn 16. From feed horn 16 the received signal passes through the circular cross-section metal waveguide 17 to the mode coupler 18. The mode coupler 18 then provides the appropriate mode signals to a modulator/receiver which, in turn, provides the error signal voltages that are proportional to the angle of arrival of the incoming wave, relative to the boresight axis of the reflectors. By way of waveguide output ports 20a, 20b, and 20c, the error voltages are generally applied to some kind of servo control system having a motor drive that automatically re-aligns the antenna with the transmission source so as to cause the error voltages to disappear.

Figure 2:
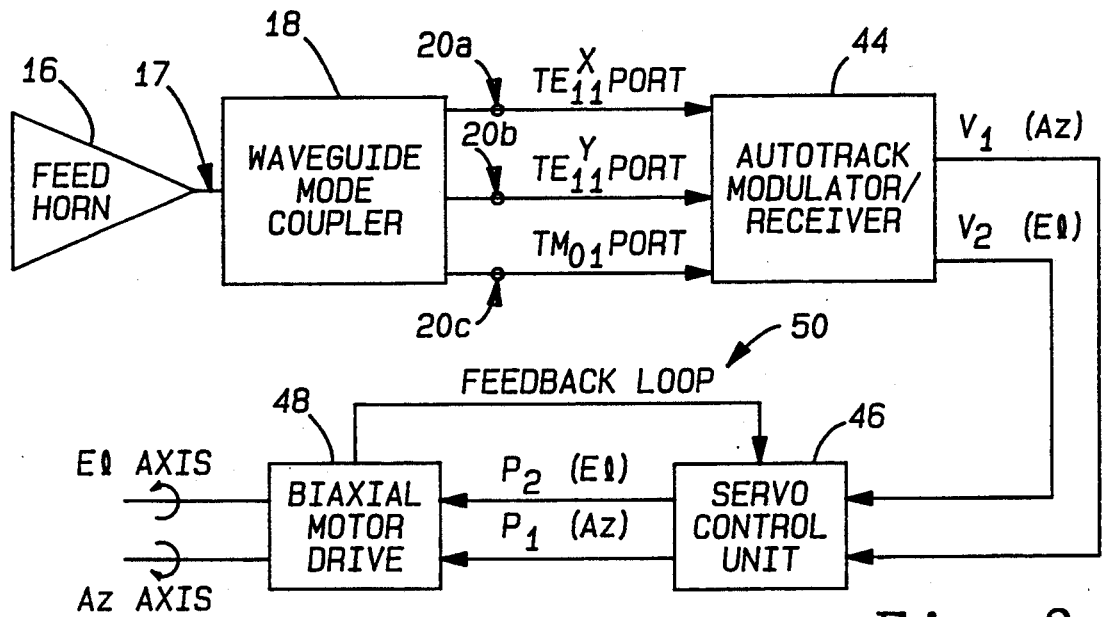
FIG. 2 is a block diagram which illustrates an autotrack antenna feed system example.

FIG. 2 is a block diagram which illustrates the autotrack antenna feed system which is designed to track a circularly polarized signal that is incident on a cassegrain reflector. The circularly polarized signal received by the feed horn 16 is conveyed to the waveguide mode coupler 18 by the circular cross-section metal waveguide 17. Both a circularly polarized $TE_{11}$ mode and a linearly polarized $TM_{01}$ are generated in the mode coupler 18. Energy corresponding to these two $TE_{11}$ and $TM_{01}$ modes is coupled via the three rectangular metal waveguides 20a, 20b and 20c to an autotrack modulator/receiver 44. The modulator/receiver 44 produces two output voltages $V_1$ and $V_2$ which, respectively, are proportional to an azimuth angle $\Phi$ and a polar angle $\theta$ of the incident wave relative to the reflector boresight axis (z-axis).

The output voltages $V_1$ and $V_2$ of the autotrack modulator/receiver 44 are provided to a servo control unit 46. The servo control unit 46 responds to the voltage signals $V_1$ and $V_2$ by energizing an azimuth-axis motor drive with power $P_1$ and an elevation-axis motor drive with power $P_2$ which are shown together as a biaxial motor drive 48. Servo control unit 46 receives a feedback signal 50 from the biaxial motor drive 48 which allows the adjustment process to continue until the reflector boresight axis is brought into coincidence with the incoming signal. The feedback signal 50 further stabilizes and smoothes the tracking process allowing the antenna to track a moving target. When the antenna is properly aligned with the incoming signal, the voltages $V_1$ and $V_2$ vanish.

Figure 3:
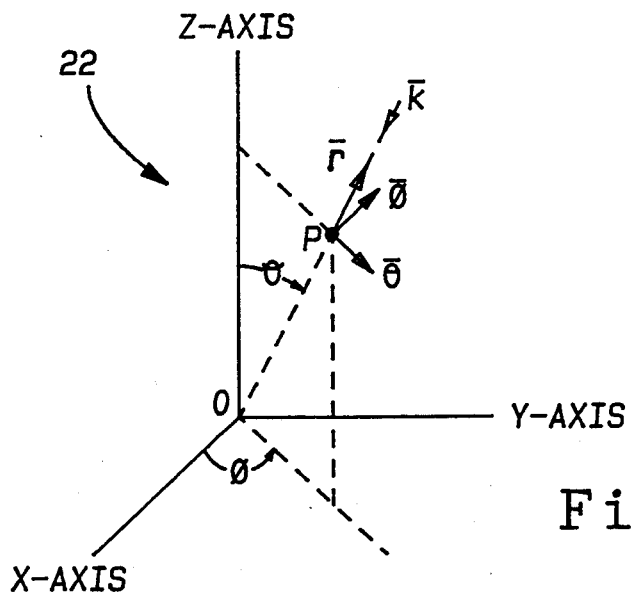
FIG. 3 is a graph which illustrates an example of a tracking antenna coordinate system.

FIG. 3 illustrates an example of a coordinate system 22 for a tracking antenna. The three dimensional coordinate system 22 illustrates both rectangular coordinates (i.e., x-axis, y-axis and z-axis) and spherical coordinates including spherical coordinate angles ($\theta$, $\Phi$) and directional unit vectors. The z-axis defines the boresight axis of the reflector. Polar angle $\theta$ defines the angle between the z-axis and the line segment OP which is normal to the incident plane wavefront. Unit vector k which is colinear with line segment OP defines the direction of the incident wave, that is, opposite to OP. Azimuth angle $\Phi$ defines the plane of incidence of the incoming wave, that is, the plane containing the z-axis and the line segment OP.

In practice, the servo system steers the antenna 10 to bring the z-axis into coincidence with the direction of the incoming signal indicated by line segment OP. This proper realignment results in $\Phi=0$ and $\theta=0$, thereby causing any autotrack error voltages to vanish.

This invention applies to any single horn, multi-mode autotrack feed system, and thus includes both circularly polarized signals as well as linearly polarized signals. When a circularly polarized plane-wave is incident on the reflector from off-axis i.e., $\theta$ unequal to 0, the field in the horn 16 aperture generates a dominant transverse electric $TE_{11}$ mode and a higher order transverse magnetic $TM_{01}$ mode in the circular waveguide and mode coupler 18. Energy corresponding to these two modes is provided in the form of voltage signals to the three output ports 20a, 20b, and 20c of the mode coupler 18.

The resulting sinusoidal voltages at the three output ports 20a, 20b, and 20c of the mode coupler 18 may be represented by the following equations:

| $TE_{11}$ Mode (x-polarized) | $V_x(t) = E_1 \cos(wt)$; |
|---|---|
| $TE_{11}$ Mode (y-polarized) | $V_y(t) = E_1 \sin(wt)$; |
| $TM_{01}$ Mode | $V_o(t) = E_o \Theta \cos(wt + \phi)$. |

The quantities $E_1$ and $E_0$ represent constants. These equations are representative examples of a circularly polarized autotrack feed system. Other kinds of signals such as a linearly polarized signal may be received and as such may take the form of different representative equations.

Figure 4:
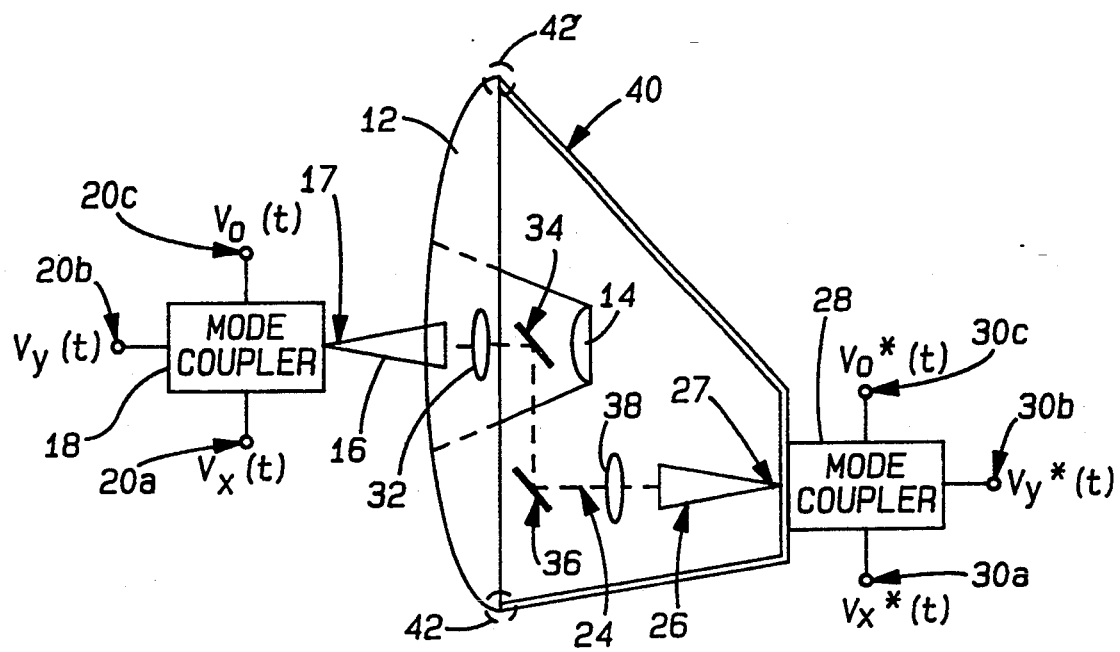
FIG. 4 is a schematic diagram which illustrates the far-field simulator for an autotrack cassegrain antenna in accordance with the present invention.

In FIG. 4, a far-field simulator is shown connected to an autotrack cassegrain antenna 10 in accordance with the present invention. The simulator includes a mode coupler 28 having three input ports 30a, 30b, and 30c for transmitting voltage signals. The mode coupler 28 is identical to the mode coupler 18 of the antenna 10 to be tested. As a result, mode coupler 28 and mode coupler 18 are adapted to have the same number of waveguide ports and to provide the same modes within the mode coupler. Mode coupler 28 is connected to transmit horn 26 by way of a circular metal waveguide 27. Transmit horn 26 is also identical to the feed horn 16 found on the antenna 10 to be tested. Together the mode coupler 28 and transmit horn 26 are adapted to provide a signal which simulates the far-field testing environment and therefore is representative of a signal detected by the autotrack antenna under receiving conditions. This signal is transmitted along the signal path 24 to the antenna 10 to be tested.

Located within the signal path 24 is a first lens 38 for focusing the transmitted signal therein. A flat reflector 36 is adapted to reflect the focused transmitted signal to a second flat reflector 34. Because the polarization sense of a circularly polarized wave is reversed on reflection from the flat reflector, an even number of reflectors must be used in configuring the signal path 24 when the wave is circularly polarized. Reflector 34 reflects the signal through a second focusing lens 32 of signal path 24 to the feed horn 16 of the antenna 10 to be tested. The signal path 24 as illustrated in FIG. 4 is adapted to transmit the signal around the sub-reflector 14 of a dual reflector antenna 10.

Figure 5:
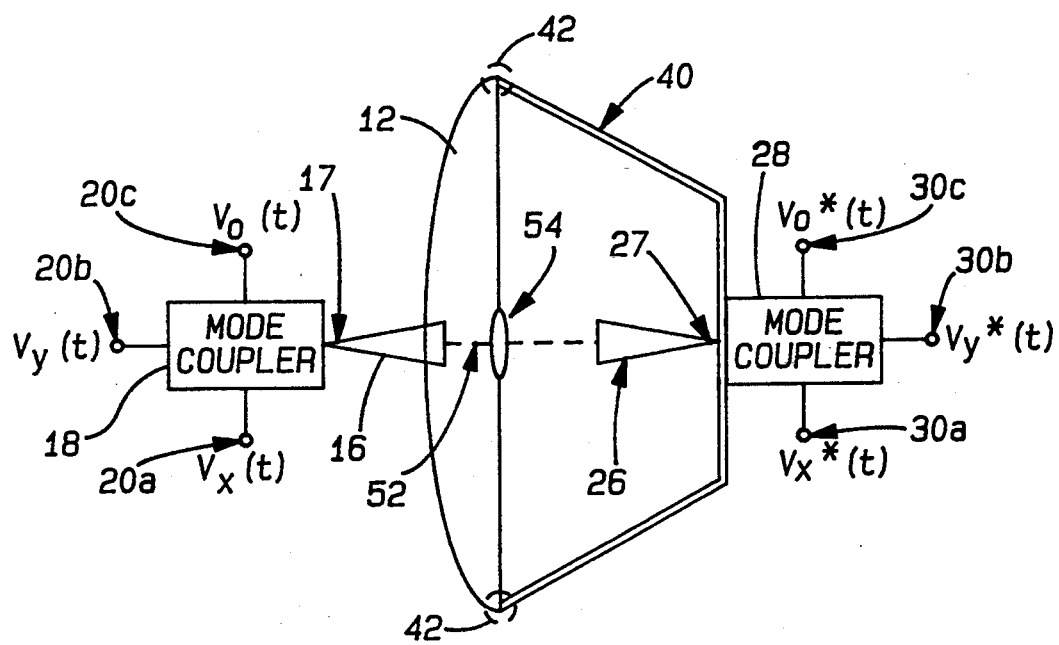
FIG. 5 is a schematic diagram which illustrates the far-field simulator for an autotrack cassegrain antenna utilizing an alternate path example in accordance with the present invention.

For the particular dual-reflector cassegrain antenna 10 shown, the sub-reflector 14 could be manually removed to allow for a straight path between the transmit horn 26 and feed horn 16 as shown in FIG. 5. The straight path 52 illustrated therein includes a single lens 54 located midway between the transmit horn 26 and the receive feed horn 16. The simulation device could also be adapted to utilize several lenses depending on the path length between transmit horn 26 and receive feed horn 16. For purposes of the invention, one of any number of different paths may be chosen without departing from this invention.

The components making up the simulation device are rigidly mounted to test fixture support frame 40. The support frame 40 is further adapted to be aligned to the antenna 10 to be tested. Support frame 40 may be aligned to the rim of the reflector 12 of the antenna 10 to be tested with devices such as pins, rods or tooling balls.

Under operational conditions, a plane wave incident on the antenna 10 shown in FIG. 1 produces the sinusoidal voltages $V_x(t)$, $V_y(t)$, and $V_o(t)$ at the output ports 20a, 20b, and 20c, respectively of the mode coupler 18. To simulate this condition using the test fixture shown in FIG. 4, the input ports 30a, 30b, and 30c of the transmit mode coupler 28 are excited with voltages $V_x^*(t)$, $V_y^*(t)$, and $V_o^*(t)$, which are the complex conjugates (i.e., equal magnitude and opposite phase) of the voltages that occurred under receiving conditions for a plane wave incident on antenna 10 from a particular direction ($\theta = \theta_o$, $\Phi = \theta_o$). The resulting electromagnetic field radiated by the transmit horn 26 propagates along a desired path 24 to the receive feed horn 16 of the antenna 10 under test. The field produced over the aperture of the feed horn 16 will exactly replicate the field that occurred under receiving conditions for the particular direction ($\theta_o, \Phi_o$). As a result, the autotrack system senses that the angle of arrival of the signal is ($\theta_o, \Phi_o$) and this data can be displayed by digital readout from the autotrack receiver.

The data required to implement the far-field simulator (i.e., complex voltage settings corresponding to specified angles of arrival) are acquired during the development and testing of a particular antenna using conventional antenna test techniques. The merit of the invention described herein is that subsequent replicas of the same antenna can be tested using only the far-field simulator to verify autotrack sensing.

In view of the foregoing, it can be appreciated that the present invention enables the user to achieve a simulation technique for testing autotrack antennas. Thus, while this invention has been disclosed herein in connection with a typical example thereof, no limitation is intended thereby except as defined by the following claims. This is because a skilled practitioner will recognize that other modifications can be made without departing from the spirit of this invention after studying the specification and drawings.

What is claimed is:

1. A simulation device for testing direction angle sensing for an autotrack antenna which has an antenna mode coupler and receiver horn, said device comprising:
    waveguide means including a transmit mode coupler having a plurality of waveguide input ports, said transmit mode coupler being substantially identical to the mode coupler of the antenna to be tested;
    a plurality of voltage signals applied to said waveguide input ports which are complex conjugates of voltage signals detected by said antenna under receiving conditions for providing selected antenna tracking information; and
    transmitter means including a transmit horn connected to the transmit mode coupler for radiating a transmit signal as a function of said voltage signals along a desired path to a receiver means of the antenna to be tested, said transmit horn being substantially identical to the receiver horn of the antenna to be tested.

2. The device as defined in claim 1 wherein said transmit mode coupler includes a plurality of waveguide modes generated by said voltage signals and provides an output signal therefrom.

3. The device as defined in claim 2, wherein said waveguide means further includes:
    a circular waveguide coupled between said transmit mode coupler and said transmit horn.

4. The device as defined in claim 3, further comprising:
    path means for providing the path between said transmit horn of the device and the receiver means of the antenna to be tested.

5. The device as defined in claim 4 wherein said path means comprises:
    focusing means including one or more lenses for focusing said transmit signal.

6. The device as defined in claim 5 wherein said path means further comprises:
    reflector means including one or more reflectors for directing said signals from said transmit horn of the simulation device to said receiver means of the antenna to be tested.

7. The device as defined in claim 6 further comprising:
    support means including a frame having mechanical means for aligning the simulation device to an antenna to be tested.

8. The device as defined in claim 7 wherein said plurality of waveguide input ports comprises at least three ports.

9. The device as defined in claim 1 further comprising display means for displaying angle of arrival data of received test signals.

10. An autotrack antenna testing device for providing accurate verification of autotrack direction angle sensing for an autotrack antenna having an antenna mode coupler and receiver means by providing a simulation of the far-field testing environment, said device comprising:
    a transmit mode coupler being substantially identical to the mode coupler of the antenna to be tested, said transmit mode coupler having a plurality of waveguide input ports:
    a plurality of voltage signals applied to said waveguide input ports and which are complex conjugates of voltage signals detected by said antenna under receiving conditions which represent far-field antenna tracking information;
    transmitter means including a transmit horn connected to the transmit mode coupler for radiating a transmit signal as a function of said voltage signals along a desired path to the receiver means of an antenna to be tested, said transmit horn being substantially identical to the receiver means of the antenna to be tested; and
    path means for providing the path between said transmit horn of the device and the receiver means of the antenna to be tested.

11. The device as defined in claim 10 further including output means for providing the results of the test.

12. The device as defined in claim 11 wherein said path means comprises:
    focusing means including one or more lenses for focusing said transmit signal.

13. The device as defined in claim 12 wherein said path means further comprises:
    reflector means including one or more reflectors for directing said signals from said transmit horn of the autotrack antenna testing device to said receiver means of the antenna to be tested.

14. The device as defined in claim 13 further comprising:
    support means including a frame having mechanical means for providing alignment of said transmit horn of the autotrack antenna testing device to an antenna to be tested.

15. A method for testing direction angle sensing for an autotrack antenna which has a waveguide receiving device and receiver means, said method comprising:

generating a plurality of input voltage signals which are complex conjugates of voltage signals detected by the antenna to be tested under receiving conditions;

applying said plurality of voltage signals to a plurality of input ports on a waveguide device having a transmit mode coupler which is substantially identical to the waveguide receiving device of the autotrack antenna to be tested and providing a directional signal response; and transmitting the directional signal along a desired path to a receiver means of the antenna to be tested, said transmitting being performed by a transmit horn which is substantially identical to the receiver means of the antenna to be tested.

16. The method as defined in claim 15 further including the step of:

directing said transmitted signal along a desired path between said transmit horn and the receiver means of the antenna to be tested.

17. An autotrack antenna testing device for providing accurate verification of autotrack direction angle sensing for an autotrack antenna which has an antenna mode coupler with a plurality of output ports and an antenna receiver, said device comprising:

input means for receiving an array of voltage signals which are complex conjugates of voltage signals generated at the output ports of an autotrack antenna under receiving conditions which represent far-field autotrack direction angle sensing information;

a transmit mode coupler which is substantially identical to the antenna mode coupler and which has a plurality of waveguide input ports connected to said input means for receiving the voltage signals;

a transmit horn connected to the transmit mode coupler for radiating a transmit signal as a function of said voltage signals along a desired path to the antenna receiver, and wherein said transmit horn is substantially identical to the antenna receiver; and means for comparing the voltage signals which are complex conjugates with voltage signal generated by said output ports of the autotrack antenna so as to verify accuracy of the autotrack direction angle sensing.

\* \* \* \* \*